United States Patent
Leeuwenburgh

[11] Patent Number: 5,886,394
[45] Date of Patent: Mar. 23, 1999

[54] DEVICE COMPRISING AN INTEGRATED COIL

[75] Inventor: Arie J. Leeuwenburgh, Eindhoven, Netherlands

[73] Assignee: U.S. Philips Corporation, New York, N.Y.

[21] Appl. No.: 995,469

[22] Filed: Dec. 22, 1997

[30]  Foreign Application Priority Data

Dec. 30, 1996 [EP] European Pat. Off. .............. 96203731

[51] Int. Cl.$^6$ .................................. H01L 27/01
[52] U.S. Cl. ........................... 257/531; 257/532; 336/200
[58] Field of Search .................................. 257/531, 532, 257/528; 336/200

[56] References Cited

U.S. PATENT DOCUMENTS 5,416,356  5/1995  Staudinger, et al. .................... 257/531

FOREIGN PATENT DOCUMENTS 0413348    2/1991  European Pat. Off. ........ H01F 17/00
62-69545A  3/1987  Japan .
WO96/28832 9/1996  WIPO ............................. H01F 17/00

Primary Examiner—John Guay
Attorney, Agent, or Firm—Brian J. Wieghaus

[57] ABSTRACT

The invention relates to a device comprising an integrated coil L on a substrate, which coil L includes a first conductor track (1) in the form of a spiral having windings (2, 3), with an outer end (6) of the first track (1) being situated on an outside of the spiral, and an inner end (7) of the first track (1) being situated on an inside of the spiral, and said coil L comprising a conductive cross-strip (10) which is connected to the inner end (7) and continues to the outside of the spiral, so that the cross-strip (10) forms a crossing (11) with a winding (3) in the spiral. A problem with such a coil L is that the crossing (11) of the cross-strip (10) and the first conductor track (1) yields a stray capacitance which adversely affects the frequency behavior of the device. In accordance with the invention, the device is characterized in that a compensation-conductor track (21) is provided which makes electric contact (31) with a first winding (2), and which demonstrates an overlap with a winding (3) adjacent to the first winding (2). The overlap between the compensation-conductor track (21) and a winding (3) forms a compensation capacitance. The effect of the stray capacitance of the crossing (11) on the frequency behavior of the coil L is compensated for by the compensation capacitance.

10 Claims, 3 Drawing Sheets

DEVICE COMPRISING AN INTEGRATED COIL

BACKGROUND OF THE INVENTION

The invention relates to a device comprising an integrated coil L on a substrate, which coil includes a first conductor track in the form of a spiral having windings, with an outer end of the first track being situated on an outside of the spiral, and an inner end of the first track being situated on an inside of the spiral, and said coil comprising a conductive cross-strip which is connected to the inner end and continues to the outside of the spiral, so that the cross-strip forms a crossing with a winding in the spiral.

Such a device can very suitably be used for applications which, dependent on the frequency of electromagnetic waves, must exhibit a specific response, such as filter devices. In practice, the coil is provided on an insulated, relatively flat substrate, such as a semiconductor substrate provided with switching elements or an insulating substrate. The coil is integrated, that is, the coil is not composed of loose, wound wire but instead is manufactured by means of techniques known from the manufacture of ICs. The coil comprises the first conductor track in the form of a spiral. A problem with such a spiral is that the inner end of the spiral is difficult to contact. For this purpose, use is made of a so-called cross-strip which makes contact with the an outside of the spiral, said cross-strip extending above or below the first conductor track.

The cross-strip is not formed in the same conductive layer as the first conductor track. The crossing between the first conductor track and the cross-strip has a specific capacitance and capacitively couples a point on the first conductor track and the cross-strip to one another. This is undesirable because this coupling adversely affects the frequency characteristic of the device, particularly at high frequencies.

A device of the type mentioned in the opening paragraph is known from the English-language summary of Japanese patent application 62-69545, which device comprises a number of crossings, and, at the location of said crossings, the first track is recessed so that a relatively thick layer of an insulating material can be provided between the cross-strip and the first track without the flatness of the device being influenced excessively. Due to this thick layer, the capacitance between the first track and the cross-strip is only small.

The above-described device in accordance with the prior art has the disadvantage that such a recess is relatively difficult to manufacture. A recess must be made in a substrate. The first track crosses this recess. There is a risk that the first track is locally interrupted or much thinner on the edges of the recess. In addition, it is necessary to provide a thick layer of an insulating material.

SUMMARY OF INVENTION

It is an object of the invention to provide, inter alia, a device which can be manufactured more readily and in which crossings of the cross-strip do not, or hardly, influence the frequency characteristic of the device.

To achieve this, the device in accordance with the invention is characterized in that a compensation-conductor track is provided which makes electric contact with a first winding and which demonstrates an overlap with a winding adjacent to the first winding. Thus, there is an additional conductor track which electrically contacts a first winding of the first conductor track and which overlaps a winding next to the first winding, that is, a preceding or subsequent winding of the first conductor track. As a result, there is no electric contact between the compensation-conductor track and the winding adjacent to the first winding; the compensation-conductor track is only capacitively coupled to the adjacent winding.

The invention is based on the recognition that the effect of stray capacitances of crossings on the frequency behavior of the coil can be compensated for by adding additional compensation capacitances to the coil by means of the compensation-conductor track. The overlap between the compensation-conductor track and the winding adjacent to the crossing forms such an additional compensation capacitance.

The integrated coil in accordance with the invention can be used as an independent coil. The device in accordance with the invention is preferably characterized in that the integrated coil L is provided with a capacitor C which is connected to the outer end of the first track and to the cross-strip, so that an LC-resonator is formed. The use of the coil in accordance with the invention in an LC-resonator precludes resonance peaks in a transfer function of the device and in the impedance behavior of the resonator as a function of the frequency.

A particular advantage is achieved if a compensation-conductor track is provided near all crossings. As a result, all stray capacitances are compensated for, so that a very good frequency behavior of the coil is achieved.

The cross-strip and the compensation-conductor track may be provided in different metal layers. Preferably, the cross-strip and the compensation-conductor track are provided in the same layer of conductive material. In this case, the compensation-conductor track can be manufactured very readily by adapting two etching masks: one etching mask for the contact holes, which etching mask is currently used to manufacture both the contact holes for connecting the cross-strip to the first track and contact holes for connecting the compensation-conductor track to the first conductor track at the location of the first windings, and a second etching mask for providing the conductive layer with a pattern, which second etching mask is currently used to manufacture both the cross-strip and the compensation-conductor track.

The device in accordance with the invention is preferably characterized in that the cross-strip has a smaller thickness and a larger width than the first track. The smaller thickness of the cross-strip precludes excessive variations in surface topography, so that problems during further processing steps, such as passivation of the surface, provision of further conductive layers and making of connections, are much smaller than they would be if a relatively thick cross-strip were used. However, such a relatively thin cross-strip has a relatively high electric resistance, so that the quality of the coil is adversely affected. This is the reason why, in the device in accordance with the invention, the width of the cross-strip is chosen to be relatively large. Such a large width leads to a reduction of the electric resistance of the cross-strip, so that good quality coils are obtained. In known devices, the width of the strip is subject to limitations, because the magnitude of the stray capacitances is governed directly by the width of the cross-strip. The wider the cross-strip, the larger the stray capacitances of the crossings are. In a device in accordance with the invention, these stray capacitances are compensated for, so that in spite of a large width of the cross-strip, a properly functioning device is obtained.

Preferably, the device in accordance with the invention is characterized in that the amount of overlap of the compensation-conductor track is larger at the location of crossings on the outside of the spiral than at the location of crossings on the inside of the spiral. The value of the compensation capacitance is determined in a first approximation by the value of the stray capacitance of the crossing and the impedance ratio between the portions of the coil situated between the electric contact which the compensation-conductor track makes with the first track, and the inner and outer ends of the coil. Thus, the value of the impedance ratio increases as the crossing is situated closer to the outside of the spiral, and hence, for a good compensation of the stray capacitances, a larger compensation capacitance is necessary. Such a larger compensation capacitance is provided by the greater amount of overlap. Said greater amount of overlap can be obtained, for example, by a larger width of the compensation-conductor track.

These and other aspects of the invention will be apparent from and elucidated with reference to the embodiments described hereinafter.

BRIEF DESCRIPTION OF THE DRAWING

In the drawings.

The Figures are purely schematic and not drawn to scale. In the Figures, corresponding parts generally bear the same reference numerals.

DESCRIPTION OF THE PREFERRED EMBODIMENTS

Figure 1:
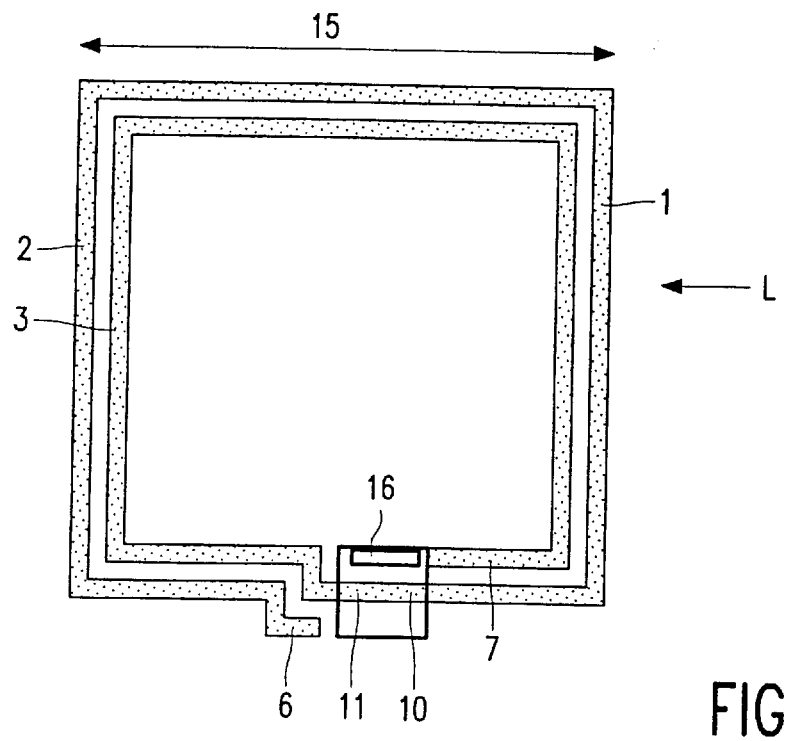
FIG. 1 is a plan view of a known integrated coil.

FIG. 1 shows an integrated coil L on a substrate (not shown), which coil comprises a first conductor track 1 in the form of a spiral having, in this example, two windings 2, 3, with an outer end 6 of the first track 1 being situated on an outside of the spiral, and an inner end 7 of the first track 1 being situated on an inside of the spiral, and the coil L comprising a conductive cross-strip 10 which is connected to the inner end 7 and continues to the outside of the spiral, so that the cross-strip forms a crossing 11 with the winding 3 in the spiral. In this example, the coil L comprises two windings, however, in practice different numbers of windings are possible depending on the desired self-induction of the coil. In practice, the coil L is provided on an insulated, relatively flat substrate, in this example an aluminium-oxide substrate. The first conductor track 1 comprises aluminium and has a width of 100 $\mu$m and a thickness of 3 $\mu$m. The distance between the windings is 50 $\mu$m. In this example, the coil L is square, the outside dimension 15 of the coil L being approximately 2000 $\mu$m. The cross-strip 10 is made of aluminium and has a width of 400 $\mu$m and a thickness of 0.1 $\mu$m. An insulating silicon-oxide layer separates the cross-strip 10 from the first conductor track 1 at the location of the crossing 11. The thickness of the oxide layer is such that between the first conductor track and the cross-strip there is a capacitance of 600 pF/mm$^2$. The cross-strip 10 is connected to the inner end 7 of the coil L via a contact hole 16 in the oxide layer.

Figure 2:
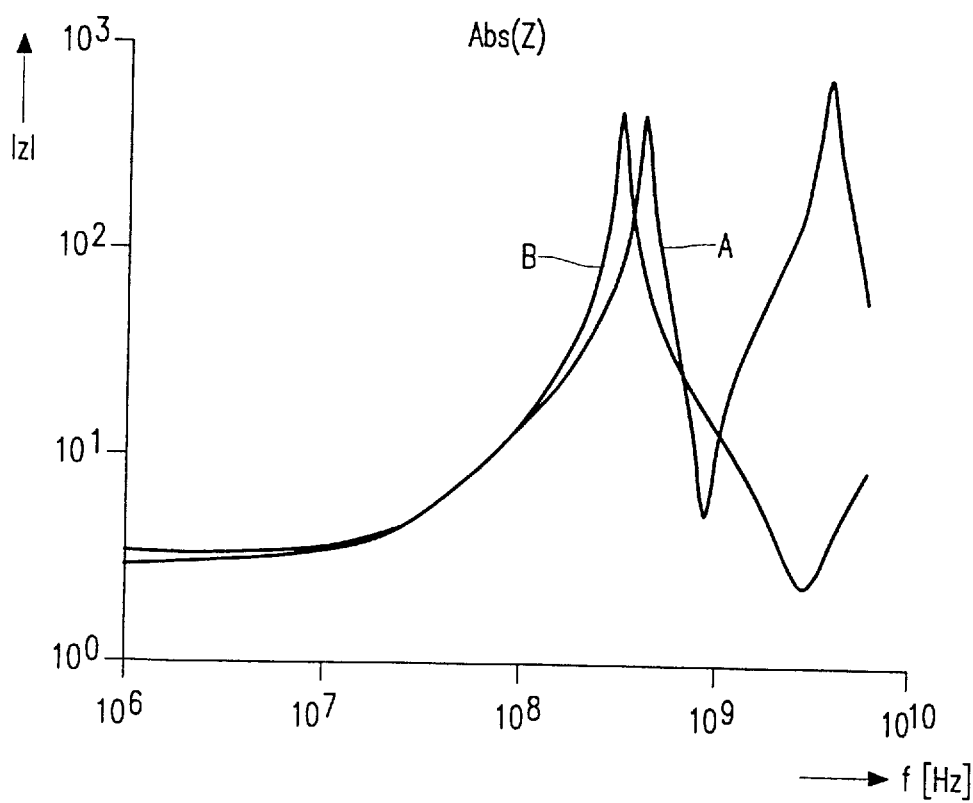
FIG. 2 shows the impedance of the known coil (curve A) and of the coil in accordance with the invention (curve B) as a function of the frequency.

In FIG. 2, curve A shows an impedance characteristic of a coil in accordance with FIG. 1. In this FIG., the frequency of the coil is plotted on the horizontal axis and the impedance characteristic of the coil is plotted on the vertical axis. This impedance characteristic is determined by the inductance of the coil, by a capacitance of the crossing 11, i.e. the capacitance between the cross-strip 10 and the first conductor track 1, by a capacitance between the first conductor track and a substrate and by a distributed capacitance between the windings 2, 3. It is obvious that the impedance of the coil has a strong, second resonance peak at approximately 4 GHz. Such a second resonance peak is generally undesirable.

Figure 3:
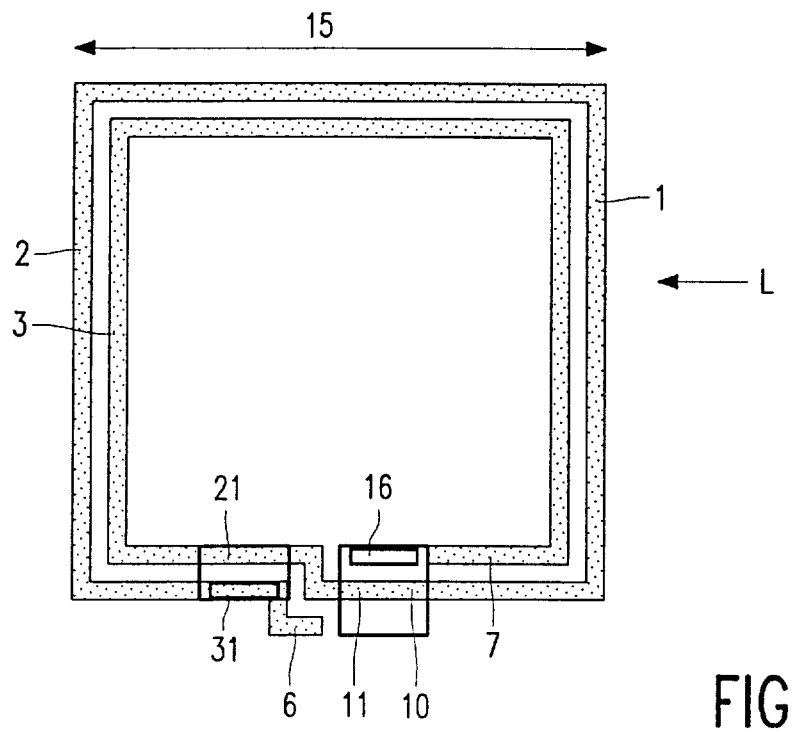
FIG. 3 is a plan view of an integrated coil in accordance with the invention.

FIG. 3 shows a device in accordance with the invention. In order to preclude resonance peaks, such a device is provided with a compensation-conductor track 21 which makes electric contact 31 with a first winding 2 and which demonstrates an overlap with a winding 3 adjacent to the first winding 2. The compensation-conductor track 21 makes electric contact with the winding 2 of the first conductor track 1 via the contact hole 31. There is no electric contact between the compensation-conductor track 21 and the winding 3 adjacent to the winding 2. The compensation-conductor track 21 is only capacitively coupled to the winding 3. It is alternatively possible that the compensation-conductor track makes electric contact with the winding 3 and demonstrates an overlap with the winding 2.

In FIG. 2, curve B shows an impedance characteristic of a coil in accordance with the invention and as shown in FIG. 3. It is obvious that the undesirable impedance peak at approximately 4 GHz has disappeared. Thus, the coil in accordance with the invention has a much more favorable impedance-variation as a function of frequency.

The cross-strip 10 and the compensation-conductor track 21 may be provided in different metal layers. In this example, the cross-strip 10 and the compensation-conductor track 21 are provided in the same layer of conductive material, namely aluminium. By virtue thereof, the compensation-conductor track 21 can be manufactured very readily by adapting an etching mask for connecting the cross-strip 10 to the first track 1, by adapting the etching mask for the contact holes 16, 31, and by adapting an etching mask for the conductive layer used for the cross-strip 10 and the compensation-conductor track 21. In this example, the cross-strip 10 has a smaller thickness and a larger width than the first track 1, i.e. a thickness of 0.1 $\mu$m and a width of 400 $\mu$m. By virtue of said smaller thickness of the cross-strip 10, excessive variations in surface topography are precluded. The electric resistance of such a cross-strip 10 is relatively low. In the device in accordance with the invention, the stray capacitances of the wide cross-strip 10 are compensated for, so that in spite of a large width of the cross-strip a properly functioning device is achieved.

Figure 4:
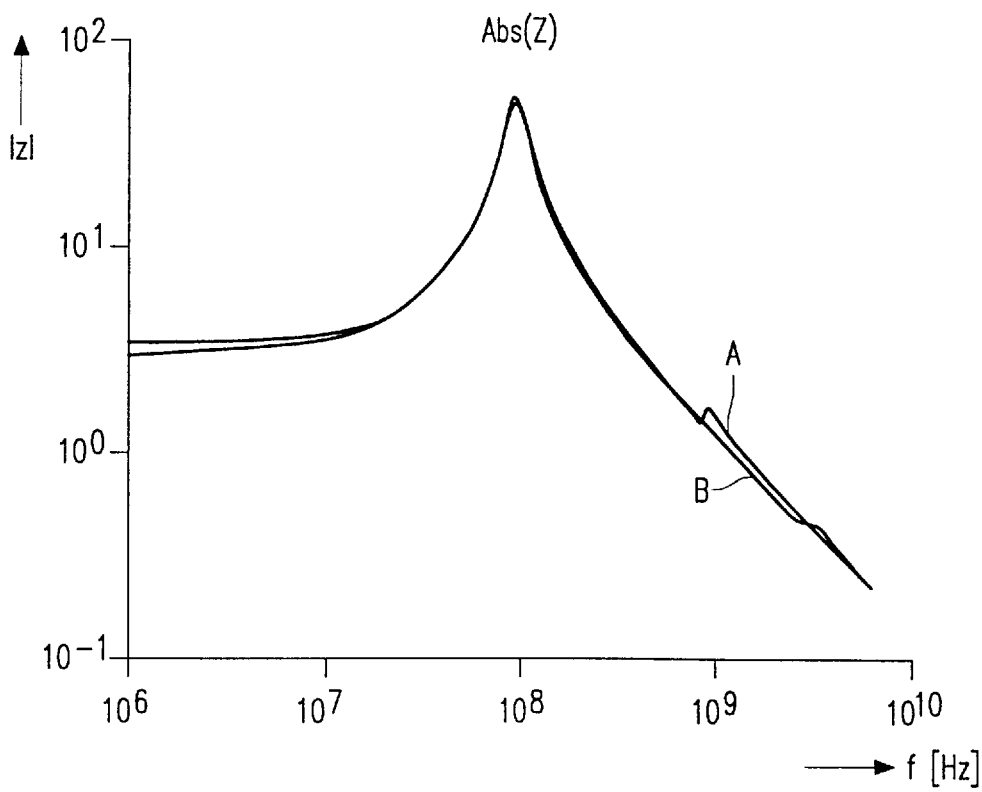
FIG. 4 shows the impedance of a known LC resonator (curve A) and of an LC resonator provided with a coil in accordance with the invention (curve B) as a function of the frequency.

The integrated coil L can be used as an independent coil. Preferably, the integrated coil L is provided with a capacitor C which is connected to the outer end 6 of the first track 1 and to the cross-strip 10, so that an LC resonator is formed. Such a device can particularly suitably be used for applications which, depending on the frequency of electromagnetic waves, must exhibit a specific response, such as a filter device. In FIG. 4, curves A and B show an impedance-characteristic of a coil provided with a parallel capacitance, so that the device has a resonance of approximately 100

MHz. Curve A shows the impedance-variation in the absence of a compensation track, curve B shows the impedance-variation in the presence of a compensation track. It is obvious that the device without a compensation track exhibits an undesirable impedance peak at approximately 1 GHz. The coil device with a compensation track does not have this resonance peak.

Figure 5:
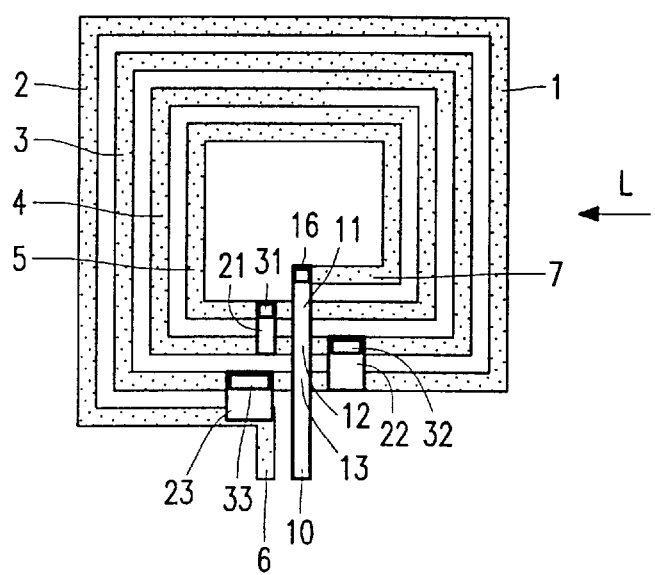
FIG. 5 is a plan view of an integrated coil having four windings in accordance with the invention.

FIG. 5 shows an integrated coil L on a substrate (not shown), which coil comprises a first conductor track 1 in the form of a spiral having, in this example, four windings 2, 3, 4, 5, with an outer end 6 of the first track 1 being situated on an outside of the spiral, and an inner end 7 of the first track being situated on an inside of the spiral, and the coil L comprising a conductive cross-strip 10 which is connected to the inner end 7 and continues to the outside of the spiral, so that the cross-strip forms crossings 11, 12, 13 with the windings 5, 4, 3 in the spiral. To preclude resonance peaks in the impedance-variation of the coil, compensation-conductor tracks 21, 22, 23 are provided which make electric contact 31, 32, 33 with the first windings 5, 4, 3 and which demonstrate an overlap with the windings 4, 3, 2 adjacent to the first windings 5, 4, 3. The compensation-conductor tracks 21, 22, 23 make electric contact with the windings 5, 4, 3 of the first conductor track 1 via contact holes 31, 32, 33. There is no electric contact between the compensation-conductor track 21, 22, 23 and the adjoining winding 4, 3, 2, respectively. The compensation-conductor track 21, 22, 23 is only capacitively coupled to the adjoining winding 4, 3, 2, respectively. The overlap between the compensation-conductor tracks 21, 22, 23 and the windings 4, 3, 2 forms compensation capacitances. The value of these capacitances is governed in known manner by the amount of overlap 0, the dielectric constant $\epsilon$ and the thickness d of the insulating layer between the cross-strip and the first conductor track: $C=\epsilon \cdot O/d$. By means of known computer-simulation programs, the network formed by the windings and the compensation capacitances, as shown in FIG. 5, can be calculated. The magnitude of the compensation capacitances is determined so that, in the impedance-characteristic, the effect of the stray capacitances formed by the crossings of the cross-strip is minimized.

Calculations show that the amount of overlap of the compensation-conductor track is larger at the location of crossings on the outside of the spiral than at the location of crossings on the inside of the spiral. In a first approximation, the value of the compensation capacitance is determined by the magnitude of the stray capacitance of the crossing and the impedance ratio between the parts of the coil situated between the electric contact which the compensation-conductor track makes with the first track, and the inner and outer ends of the coil. The value of the impedance ratio increases as the crossing is situated closer to the outside of the spiral, and hence a larger compensation capacitance is necessary to properly compensate for the stray capacitances. Such a larger compensation capacitance is achieved by said larger overlap. The larger overlap is obtained by a larger width of the compensation-conductor track.

The invention is not limited to the examples described hereinabove. For example, in the examples, specific materials are used for the first conductor track, the cross-strip, the compensation-conductor track and the insulating layer between the cross-strip and the first conductor track. It will be obvious that other materials, such as tungsten, copper, titanium nitride or molybdenum can alternatively be used as the material for a conductor track, while insulating materials, such as nitrides or oxynitrides, can be used for the insulating layer. Further, it is alternatively possible to provide the coil on a substrate of a material other than aluminium oxide, such as a glass plate or an insulated semiconducting substrate. In the latter case, the semi-conducting (for example silicon-)substrate may comprise semiconducting switching elements which, in combination with the coil or the LC resonator, form the device. The device can be manufactured by means of known techniques. The material for the conductor tracks can be provided by means of techniques such as vapor deposition, chemical vapor deposition (CVD) or electrodeposition. The insulating layer is applied by means of known techniques, such as vapor deposition, CVD and the like. Techniques such as photolithography and etching are used to form the conductor tracks from the materials provided and the contact holes. In the examples, the compensation-conductor tracks are drawn with a constant width over the entire length. Alternatively, the width may vary, so that, for example, the width is small at the location of the electric contact and large at the location of the overlap. The invention is not limited to the frequencies described in the examples. In general, the effects of the invention are greater at higher frequencies.

I claim:

1. A device, comprising:
   a substrate;
   an integrated coil on the substrate, which coil includes a first conductor track in the form of a spiral having windings, with an outer end of the first track being situated on an outside of the spiral, and an inner end of the first track being situated on an inside of the spiral, and said coil comprising a conductive cross-strip which is connected to the inner end and continues to the outside of the spiral, so that the cross-strip forms a crossing with windings in the spiral; and
   compensation-conductor track which makes electric contact with a first winding and which demonstrates an overlap with a winding adjacent to the first winding.

2. A device as claimed in claim 1, further comprising a capacitor connected to the outer end of the first track and to the cross-strip, so that an LC-resonator is formed.

3. A device as claimed in claim 2, characterized in that a respective compensation-conductor track is near each crossing of the cross strip with the winding in the spiral.

4. A device as claimed in claim 3, characterized in that the cross-strip and the compensation-conductor track are provided in the same layer of conductive material.

5. A device as claimed in claim 4, characterized in that the cross-strip has a smaller thickness and a larger width than the first track.

6. A device as claimed in claim 5, characterized in that the amount of overlap of the compensation-conductor track is larger at the location of crossings on the outside of the spiral than at the location of crossings on the inside of the spiral.

7. A device as claimed in claim 1, characterized in that the amount of overlap of the compensation-conductor track is larger at the location of crossings on the outside of the spiral than at the location of crossings on the inside of the spiral.

8. A device as claimed in claim 1, characterized in that the cross-strip has a smaller thickness and a larger width than the first track.

9. A device as claimed in claim 1, characterized in that the cross-strip and the compensation-conductor track are in the same layer of conductive material.

10. A device as claimed in claim 1, characterized in that a respective compensation-conductor track is near each crossing of the cross strip with the windings in the spiral.

* * * * *